United States Patent
Lee et al.

(10) Patent No.: US 10,504,581 B1
(45) Date of Patent: Dec. 10, 2019

(54) MEMORY APPARATUS AND OPERATING METHOD THEREOF

(71) Applicant: NANYA TECHNOLOGY CORPORATION, New Taipei (TW)

(72) Inventors: Wen-Ming Lee, Miaoli County (TW); Chuan-Jen Chang, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/018,060

(22) Filed: Jun. 26, 2018

(51) Int. Cl.
*G11C 11/406* (2006.01)
*G11C 11/4063* (2006.01)

(52) U.S. Cl.
CPC .... *G11C 11/40626* (2013.01); *G11C 11/4063* (2013.01)

(58) Field of Classification Search
CPC ............ G11C 11/4063; G11C 11/40626
USPC .................................. 365/194, 222
See application file for complete search history.

(56) References Cited

U.S. PATENT DOCUMENTS

| 5,276,843 | A | 1/1994 | Tillinghast et al. |
| 9,766,135 | B2 | 9/2017 | Walker |
| 2005/0276139 | A1 | 12/2005 | Choi et al. |
| 2016/0365138 | A1* | 12/2016 | Cho ................. G11C 11/40626 |
| 2017/0117033 | A1* | 4/2017 | Doo ..................... G11C 11/4091 |
| 2019/0187737 | A1* | 6/2019 | Matsudaira ............ G05F 3/205 |

OTHER PUBLICATIONS

Reza Moghimi, Curing Comparator Instability with Hysteresis, Analog Dialogue, 34-7 (Year: 2000).*
"Office Action of Taiwan Counterpart Application", dated May 14, 2019, pp. 1-6.
"Search Report of Europe Counterpart Application", dated Jun. 14, 2019, p. 1-p. 8.

* cited by examiner

*Primary Examiner* — Han Yang
(74) *Attorney, Agent, or Firm* — JCIPRNET

(57) ABSTRACT

A memory apparatus and an operating method thereof are provided. The memory apparatus includes a memory, a temperature sensor and a control circuit. The temperature sensor senses a temperature of the memory and generating a temperature sensing signal. The control circuit is coupled to the memory and the temperature sensor. The control circuit performs access operation on the memory and changes a frequency of the access operation with reference of a delay curve according to the temperature sensing signal.

8 Claims, 4 Drawing Sheets

MEMORY APPARATUS AND OPERATING METHOD THEREOF

BACKGROUND

Technical Field

The disclosure relates to an electronic device, and particularly relates to a memory apparatus and an operating method thereof.

Description of Related Art

Dynamic Random Access Memory (DRAM) devices continue to be a preferred memory for storing data in electronic systems. Since the leakage current is small at low temperature, the controller of the memory device will lower the refresh frequency of the memory device to reduce power con consumption when the temperature of the memory device is lower than a predetermined temperature. However, if the temperature of the memory device changes frequently around the predetermined temperature, system crash may occur due to the unstable temperature. In order to avoid the system crash, it is chosen not to change the refresh frequency of the memory device in response to the temperature of the memory device, which will result in the increase in power consumption of the memory device.

SUMMARY

The disclosure is directed to a memory apparatus and an operating method thereof, by which high reliability and low power consumption of the memory apparatus are achieved at the same time.

An embodiment of the disclosure provides a memory apparatus. The memory apparatus includes a memory, a temperature sensor and a control circuit. The temperature sensor senses a temperature of the memory and generating a temperature sensing signal. The control circuit is coupled to the memory and the temperature sensor. The control circuit performs access operation on the memory and changes a frequency of the access operation with reference of a delay curve according to the temperature sensing signal.

In an embodiment of the disclosure, the control circuit decreases the frequency of the access operation when the temperature of the memory changing from a temperature above a first threshold to a temperature below the first threshold and increases the frequency of the access operation when the temperature of the memory changing from a temperature below a second threshold to a temperature above the second threshold. The first threshold is smaller than the second threshold.

In an embodiment of the disclosure, the temperature sensor includes a hysteresis comparator, a first resistance and a second resistance. The negative input terminal of the hysteresis comparator receives a threshold voltage. The first resistance is coupled between a positive input terminal of the hysteresis comparator and a temperature sensing voltage. The second resistance is coupled to the positive input terminal of the hysteresis comparator and an output terminal of the hysteresis comparator, the output terminal of the hysteresis comparator outputs the temperature sensing signal.

In an embodiment of the disclosure, the access operation includes refresh operation.

In an embodiment of the disclosure, the memory apparatus further includes a storage storing the temperature sensing signal.

In an embodiment of the disclosure, the storage includes a multi-purpose register.

An embodiment of the disclosure provides an operating method of a memory apparatus includes the following steps. Sense a temperature of a memory and generating a temperature sensing signal. Change a frequency of access operation with reference of a delay curve according to the temperature sensing signal.

In an embodiment of the disclosure, the operating method of a memory apparatus includes the following steps. Decrease the frequency of the access operation when the temperature of the memory changing from a temperature above a first threshold to a temperature below the first threshold. Increase the frequency of the access operation when the temperature of the memory changing from a temperature below a second threshold to a temperature above the second threshold, wherein the first threshold is smaller than the second threshold.

In an embodiment of the disclosure, the operating method of a memory apparatus includes the step of storing the temperature sensing signal into a storage.

In an embodiment of the disclosure, the storage comprises a multi-purpose register.

According to the above description, in the embodiment of the disclosure, the control circuit changes the frequency of the access operation with reference of the delay curve according to the temperature sensing signal, so as to avoid changing the frequency of the access operation frequently when the temperature of the memory apparatus changing frequently around a predetermined temperature, and thus high reliability and low power consumption of the memory apparatus can be achieved at the same time.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
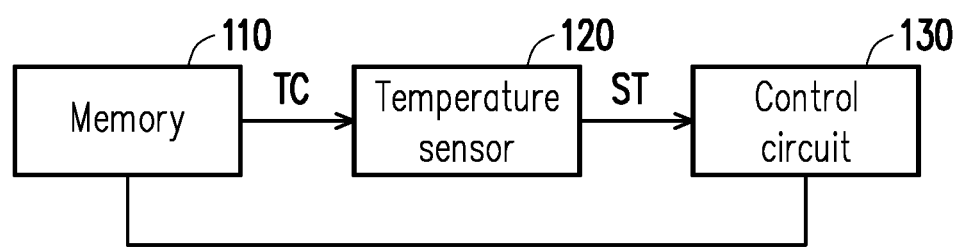
FIG. 1 is a schematic diagram of a memory apparatus according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1 is a schematic diagram of a memory apparatus according to an embodiment of the disclosure. Referring to FIG. 1, the memory apparatus 100 may be a computer or a mobile phone for example, which includes memory 110, a temperature sensor 120, and a control circuit 130. The control circuit 130 is coupled to the memory 110 and the temperature sensor 120, the control circuit 130 may be implemented with a processor or a microcontroller, but is not limited thereto. The memory 110 may be implemented with a dynamic random access memory (DRAM), though the disclosure is not limited thereto. The temperature sensor 120 senses the temperature TC of the memory 110 and generating a temperature sensing signal ST, where the temperature sensor 120 may be implemented with a thermistor, for example, though the disclosure is not limited thereto. The temperature sensor 120 may be integrated into the memory 110 in some embodiments, and the memory 110 may include a storage (for example, multi-purpose register, but is not limited thereto) to store the temperature sensing signal ST. The control circuit 130 may access the storage to obtain the temperature sensing signal ST.

The control circuit 130 performs access operation on the memory, the access operation is refresh operation in the embodiment of FIG. 1, but is not limited thereto, in some embodiments, the embodiment may include write operation or verification operation for example. The temperature sensor 120 compares the temperature of the memory 110 to determine whether the temperature of the memory 110 changes from a temperature above a first threshold to a temperature below the first threshold or changes from a temperature below a second threshold to a temperature above the second threshold, and output the temperature sensing signal ST correspondingly. The control circuit 130 changes the frequency of the access operation with reference of a delay curve according to the temperature sensing signal ST.

Figure 2:
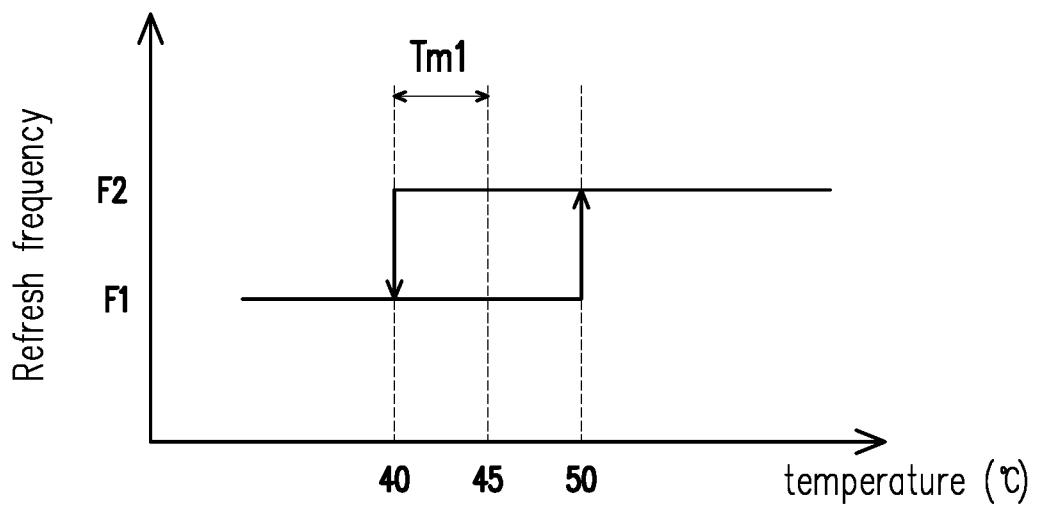
FIG. 2 is schematic diagram illustrates the relationship between the refresh frequency of the memory and temperature of memory the according to an embodiment of the disclosure.

For example, FIG. 2 is schematic diagram illustrates the relationship between the refresh frequency of the memory and temperature of memory the according to an embodiment of the disclosure. The control circuit 130 changes the refresh frequency of refresh operation (that is, the number of the refresh operations performed per unit time) with reference of a delay curve according to the temperature sensing signal ST. As shown in FIG. 2, when the temperature of the memory 110 changing from a temperature above 40° C. to a temperature below 40° C., the temperature sensor 120 outputs the temperature sensing signal ST (a bit value "00", for example) to inform the control circuit 130 to decrease the refresh frequency to frequency F1, and when the temperature of the memory 110 changing from a temperature below 50° C. to a temperature above 50° C., the temperature sensor 120 outputs the temperature sensing signal ST (a bit value "01" for example) to inform the control circuit 130 to increase the refresh frequency to frequency F2. That is, the temperature margin Tm1 of the delay curve shown in FIG. 2 is 5° C., though the disclosure is not limited thereto. Therefore, when the temperature of the memory 110 changes frequently around the predetermined temperature (which is 45° C. in this embodiment), crush of the memory apparatus 100 can be avoided and lower the power consumption of the memory apparatus 100 can be achieved.

Figure 3:
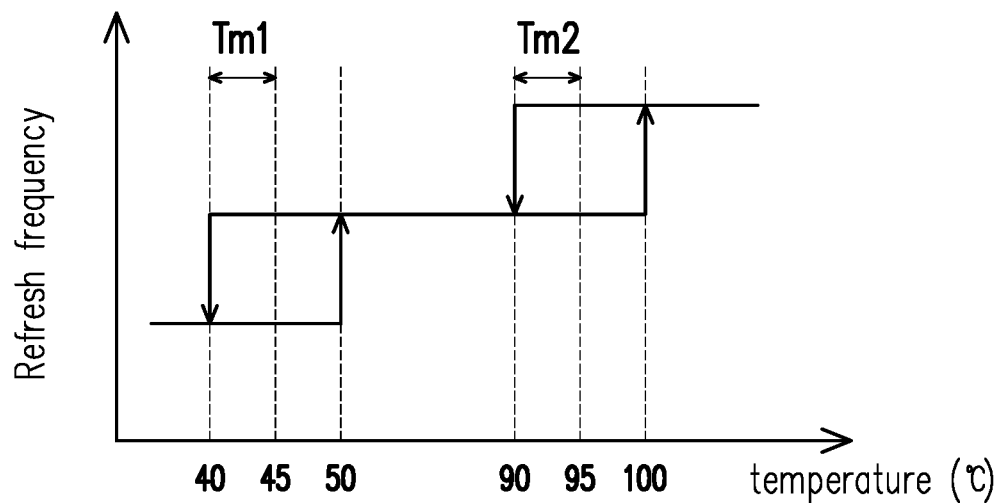
FIG. 3 is another schematic diagram illustrates the relationship between the refresh frequency of the memory and temperature of memory the according to an embodiment of the disclosure.

It is noted that, in some embodiments, the temperature sensor 120 may further output the temperature sensing signal ST with respect to another predetermined temperature. For example, FIG. 3 is another schematic diagram illustrates the relationship between the refresh frequency of the memory and temperature of memory the according to an embodiment of the disclosure. In this embodiment, the temperature sensor 120 further outputs the temperature sensing signal ST with respect to 95° C. to inform the control circuit 130 to adjust the refresh frequency. For example, the temperature sensor 120 may output a bit value "01" when the temperature of the memory 110 changing from a temperature above 90° C. to a temperature below 90° C., and the control circuit 130 decreases the refresh frequency correspondingly. The temperature sensor 120 may output a bit value "10" when the temperature of the memory 110 changing from a temperature below 100° C. to a temperature above 100° C. (that is, the temperature margin Tm2 is 5° C., but is not limited thereto, the temperature margin Tm2 may be different from the temperature margin Tm1 in other embodiments), and the control circuit 130 increase the refresh frequency correspondingly.

Figure 4:
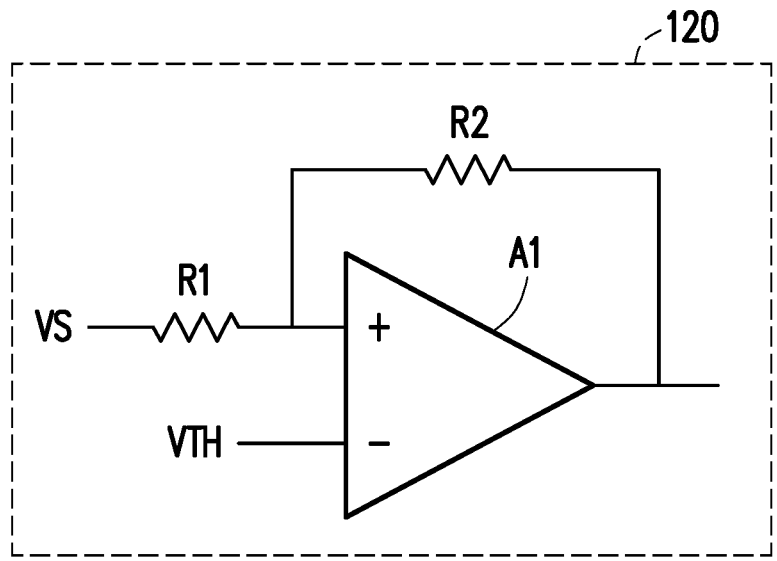
FIG. 4 is a schematic diagram of a temperature sensor according to an embodiment of the disclosure.

FIG. 4 is a schematic diagram of a temperature sensor according to an embodiment of the disclosure. Referring to FIG. 4, in some embodiments, the temperature sensor 120 may include a temperature sensor A1 and resistances R1 and R2, the resistance R1 is coupled between the positive input terminal of the hysteresis comparator A1 and a temperature sensing voltage VS (the temperature sensing voltage VS reflects the temperature of the memory 110), the resistance R2 is coupled between the positive input terminal of the hysteresis comparator A1 and the output terminal of the hysteresis comparator A1, and the negative input terminal of the hysteresis comparator A1 receives a threshold voltage VT. The hysteresis comparator A1 may output an output voltage as the temperature sensing signal ST to the control circuit 130 or output a bit value as the temperature sensing signal ST to the control circuit 130, so as to make the control circuit 130 adjust the refresh frequency of the memory 110 according to the temperature sensing signal ST. The temperature margin Tm1 and the temperature margin Tm2 can be changed by adjusting the resistance values of the resistances R1 and R2.

Figure 5:
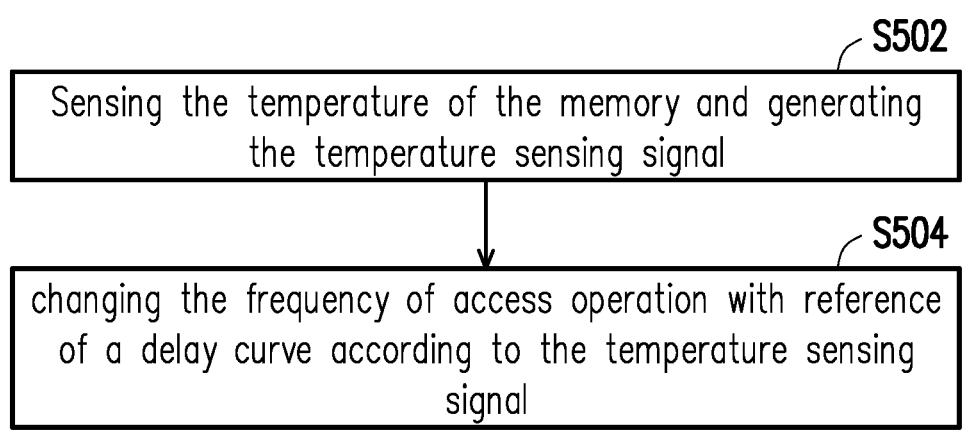
FIG. 5 is the flowchart of an operating method of the memory apparatus according to an embodiment of the disclosure.

FIG. 5 is the flowchart of an operating method of the memory apparatus according to an embodiment of the disclosure. It can be seen from the above embodiments, the operating method of the memory apparatus may at least include the following steps. First, sensing the temperature of the memory and generating the temperature sensing signal (step S502), and then changing the frequency of access operation with reference of a delay curve according to the temperature sensing signal (step S504).

Figure 6:
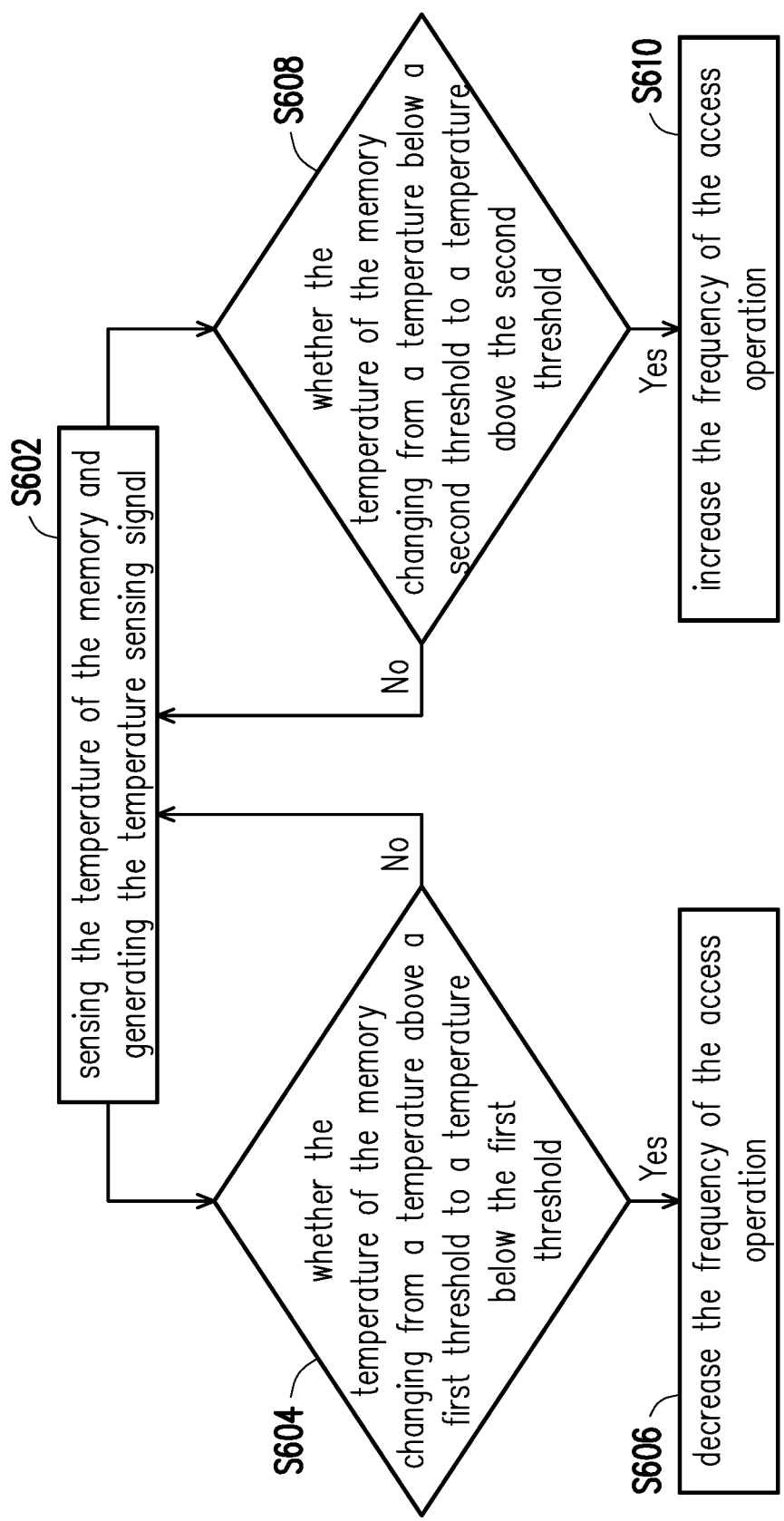
FIG. 6 is the flowchart of operating method of the memory apparatus according to another embodiment of the disclosure.

For example, FIG. 6 is the flowchart of operating method of the memory apparatus according to another embodiment of the disclosure. In step S602, the temperature sensor 120 of the embodiment of FIG. 1 senses the temperature of the memory 110. In step S604, the temperature sensor 120 determines whether the temperature of the memory 110 changing from a temperature above a first threshold to a temperature below the first threshold, when the temperature of the memory 110 changes from a temperature above the first threshold to a temperature below the first threshold, the temperature sensor 120 outputs the temperature sensing signal ST (for example, bit value "00") to inform the control circuit 130 to decrease the frequency of the access operation (step S606). In contrast, if the temperature of the memory 110 does not change from a temperature above the first threshold to a temperature below the first threshold, the temperature sensor 120 keeps senses the temperature of the memory 110 (step S602).

In step S608, the temperature sensor 120 determines whether the temperature of the memory 110 changing from a temperature below a first threshold to a temperature above the second threshold, the first threshold is smaller than the second threshold. When the temperature of the memory 110 changes from a temperature below the second threshold to a temperature above the second threshold, the temperature sensor 120 outputs the temperature sensing signal ST (for example, bit value "01") to inform the control circuit 130 to increase the frequency of the access operation (step S610). In contrast, if the temperature of the memory 110 does not change from a temperature below the second threshold to a temperature above the second threshold, the temperature sensor 120 keeps senses the temperature of the memory 110 (step S602). Thus, the frequency of the access operation will not be changed frequently when the temperature of the memory apparatus changing frequently around the predetermined temperature, and high reliability, high stability and the low power consumption of the memory apparatus can be achieved at the same time. In some embodiment, the temperature sensing signal may be stored into a storage (multi-purpose register, for example), and the temperature sensing signal can be obtaining by accessing the storage. The access operation is refresh operation for example, but is not limited thereto.

In summary, in the embodiment of the disclosure, the control circuit changes the frequency of the access operation with reference of the delay curve according to the temperature sensing signal, so as to avoid changing the frequency of the access operation frequently when the temperature of the memory apparatus changing frequently around a predetermined temperature, and thus high reliability, high stability and low power consumption of the memory apparatus can be achieved at the same time.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A memory apparatus, comprising:
    a memory;
    a temperature sensor, sensing a temperature of the memory and generating a temperature sensing signal; and
    a control circuit, coupled to the memory and the temperature sensor, performing access operation on the memory, and changing a frequency of the access operation with reference of a hysteresis curve according to the temperature sensing signal,
    wherein the control circuit decreases the frequency of the access operation when the temperature of the memory changing from a temperature above a first threshold to a temperature below the first threshold and increases the frequency of the access operation when the temperature of the memory changing from a temperature below a second threshold to a temperature above the second threshold, wherein the first threshold is smaller than the second threshold.

2. The memory apparatus as claimed in claim 1, wherein the temperature sensor comprises:
    a hysteresis comparator, a negative input terminal of the hysteresis comparator receives a threshold voltage;
    a first resistance, coupled between a positive input terminal of the hysteresis comparator and a temperature sensing voltage; and
    a second resistance, coupled to the positive input terminal of the hysteresis comparator and an output terminal of the hysteresis comparator, the output terminal of the hysteresis comparator outputs the temperature sensing signal.

3. The memory apparatus as claimed in claim 1, wherein the access operation comprises refresh operation.

4. The memory apparatus as claimed in claim 1, further comprises:
    a storage, storing the temperature sensing signal.

5. The memory apparatus as claimed in claim 4, wherein the storage comprises a multi-purpose register.

6. An operating method of a memory apparatus, comprising:
    sensing a temperature of a memory and generating a temperature sensing signal;
    changing a frequency of access operation with reference of a hysteresis curve according to the temperature sensing signal;
    decreasing the frequency of the access operation when the temperature of the memory changing from a temperature above a first threshold to a temperature below the first threshold; and
    increasing the frequency of the access operation when the temperature of the memory changing from a temperature below a second threshold to a temperature above the second threshold, wherein the first threshold is smaller than the second threshold.

7. The operating method of a memory apparatus as claimed in claim 6, comprising:
    storing the temperature sensing signal into a storage; and
    accessing the storage to obtain the temperature sensing signal.

8. The operating method of a memory apparatus as claimed in claim 7, wherein the storage comprises a multi-purpose register.

* * * * *